(12) United States Patent
Horiguchi et al.

(10) Patent No.: US 10,388,662 B2
(45) Date of Patent: Aug. 20, 2019

(54) MANUFACTURING METHOD OF SEMICONDUCTOR MEMORY DEVICE

(71) Applicant: TOSHIBA MEMORY CORPORATION, Minato-ku, Tokyo (JP)

(72) Inventors: Kazunori Horiguchi, Nagoya Aichi (JP); Takashi Ohashi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 102 days.

(21) Appl. No.: 15/695,892

(22) Filed: Sep. 5, 2017

(65) Prior Publication Data

US 2018/0269223 A1    Sep. 20, 2018

(30) Foreign Application Priority Data

Mar. 16, 2017 (JP) ................................ 2017-051376

(51) Int. Cl.
| | | |
|---|---|---|
| H01L 21/66 | (2006.01) | |
| H01L 27/11582 | (2017.01) | |
| H01L 21/02 | (2006.01) | |
| H01L 27/1157 | (2017.01) | |
| H01L 21/311 | (2006.01) | |

(52) U.S. Cl.
CPC .... *H01L 27/11582* (2013.01); *H01L 21/0217* (2013.01); *H01L 21/02164* (2013.01); *H01L 22/12* (2013.01); *H01L 22/20* (2013.01); *H01L 27/1157* (2013.01); *H01L 21/31116* (2013.01)

(58) Field of Classification Search
CPC ...................................................... H01L 22/12
See application file for complete search history.

(56) References Cited

U.S. PATENT DOCUMENTS

| | | |
|---|---|---|
| 5,578,161 A | 11/1996 | Auda |
| 8,409,977 B2 | 4/2013 | Shim et al. |
| 8,415,242 B2 | 4/2013 | Mizushima et al. |
| 2005/0255611 A1* | 11/2005 | Patterson ........... G01R 31/2894 438/14 |
| 2012/0050739 A1* | 3/2012 | Hayano ................. G01B 11/24 356/369 |
| 2018/0040626 A1* | 2/2018 | Zhu ................... H01L 27/11582 |
| 2018/0102375 A1* | 4/2018 | Pang ................. H01L 27/11519 |

* cited by examiner

*Primary Examiner* — Peniel M Gumedzoe
*Assistant Examiner* — Christopher A Johnson
(74) *Attorney, Agent, or Firm* — Foley & Lardner LLP (57) ABSTRACT

A manufacturing method of a semiconductor memory device includes disposing a first stacked body on a substrate, forming a first through via hole in the first stacked body, and determining to remove an upper portion of the first stacked body based on a comparison of a determined value of a width of the first through via hole with a reference value. The method further includes forming a second film in the first through via hole responsive to the determination to remove the upper portion of the first stacked body, removing the upper portion of the first stacked body and a portion of the second film, and disposing a second stacked body on the first stacked body and the second film. The method further includes forming a second through via hole to expose at least a portion of the second film, and removing the second film in the first through via hole.

7 Claims, 7 Drawing Sheets

MANUFACTURING METHOD OF SEMICONDUCTOR MEMORY DEVICE

CROSS-REFERENCE TO RELATED APPLICATION

This application claims the benefit of and priority to Japanese Patent Application No. 2017-051376; filed Mar. 16, 2017; the entire contents of which are incorporated herein by reference.

FIELD

Embodiments described herein relate generally to a semiconductor memory device and a manufacturing method of a semiconductor memory device.

BACKGROUND

In some comparative semiconductor memory devices having a three-dimensional structure, a memory hole is formed in a stacked body that includes stacked electrode films, and a charge storage film and a channel are provided in the memory hole. The electrode film can serve as a control gate in a memory cell, and thus a total number of stacked electrode films may be increased, thereby making it possible to increase the total number of memory cells. In such a semiconductor memory device, when the number of stacked electrode films is increased, the aspect ratio of the stacked body is increased, and it can thus be difficult to form the memory hole. Therefore, an efficiency of producing the memory device may be reduced, or the number of processes and cost of manufacturing the memory device may increase.

DETAILED DESCRIPTION

One or more embodiments of the present disclosure provide for a manufacturing method of a semiconductor memory device in which the productivity is improved and the manufacturing cost is reduced.

In one or more embodiments according to an aspect for the present disclosure, a manufacturing method of a semiconductor memory device includes disposing a first stacked body on a substrate, forming a first through via hole in the first stacked body, and determining to remove an upper portion of the first stacked body based on a comparison of a determined value of a width of the first through via hole with a reference value. The method further includes forming a second film in the first through via hole responsive to the determination to remove the upper portion of the first stacked body, removing the upper portion of the first stacked body and a portion of the second film, and disposing a second stacked body on the first stacked body and the second film. The method further includes forming a second through via hole to expose at least a portion of the second film, and removing the second film in the first through via hole.

In the following description, embodiments of the present disclosure are described with reference to the drawings. The drawings are schematic or conceptual, and a relation between a thickness and a width of each component, a ratio of sizes between components and the like may be different from actual values. Even when the same component is described, the dimensions and the ratios thereof may differ in the drawings in some cases.

In addition, in the present disclosure and the drawings, the same reference numerals are used to refer to same or similar elements in different drawings, and a redundant detailed description thereof is appropriately omitted in some cases.

Figure 1:
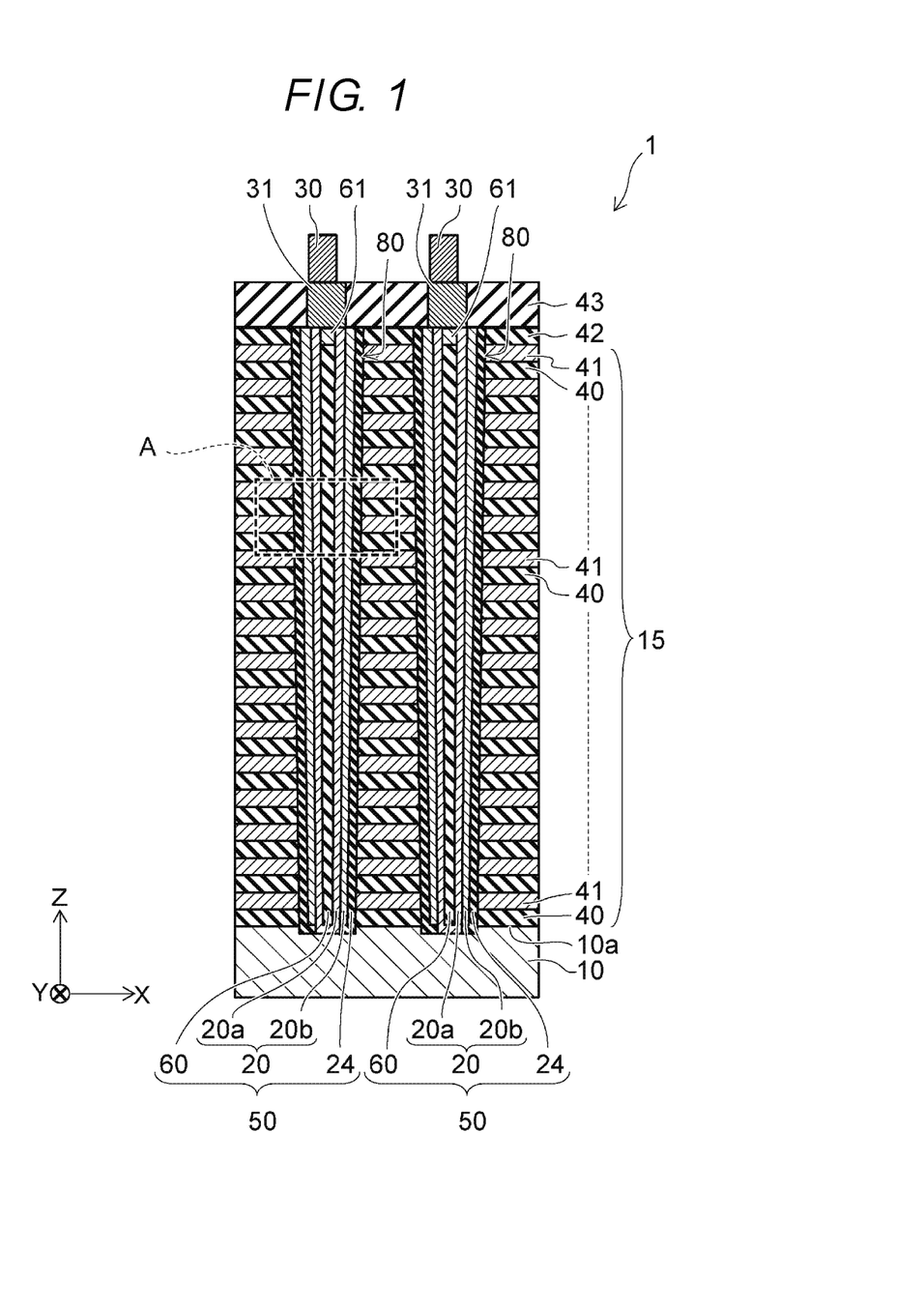
FIG. 1 is a sectional view illustrating a semiconductor memory device according to one or more embodiments.
Figure 2:
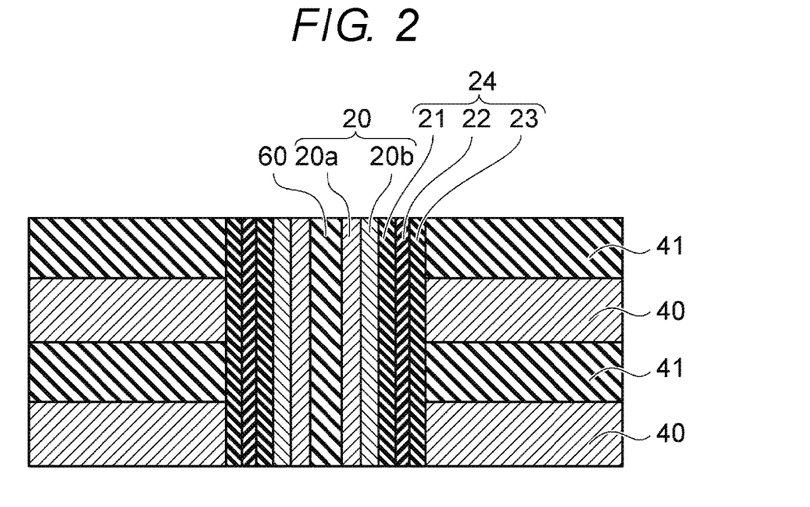
FIG. 2 is an enlarged view of a region A shown in FIG. 1.

FIG. 1 is a sectional view illustrating some embodiments of a semiconductor memory device 1 according to an aspect of the present disclosure. FIG. 2 is an enlarged view of a region A shown in FIG. 1.

As illustrated in FIG. 1, the semiconductor memory device 1 is includes a stacked body 15 and columnar sections 50. The semiconductor memory device 1 defines memory holes 80.

The stacked body 15 is provided on a substrate 10. The substrate 10, for example, includes silicon (Si). In the present disclosure, two directions, which are parallel to an upper surface 10a of the substrate 10 and perpendicular to each other, are referred to as an X direction and a Y direction. A direction perpendicular to both the X direction and the Y direction is referred to as a Z direction. The term "stack direction" may refer to a direction of extension of the stacked body 15 (the Z direction in FIG. 1).

The stacked body 15 includes a plurality of electrode films 41 and a plurality of insulating films 40. Of the plurality of electrode films 41, a first electrode film 41 positioned at a lowermost layer of the stacked body 15 can serve as a source-side selection gate and is provided on the substrate 10 via the insulating film 40. Of the plurality of electrode films 41, a second electrode film 41 positioned at an uppermost layer of the stacked body 15 can serve as a drain-side selection gate. Of the plurality of electrode films 41, one or more electrode films 41 positioned between the first electrode film 41 of the lowermost layer and the second electrode film 41 of the uppermost layer can serve as, or can constitute at least part of, a word line. The electrode films 41, for example, include a metal such as tungsten (W). The insulating films 40 are respectively provided between the electrode films 41. The insulating films 40, for example, include silicon oxide (SiOx). For example, the number of stacked electrode films 41 and the number of stacked insulating films 40 are each in a range of about 20 layers to about 50 layers.

An insulating film 42 is provided on the stacked body 15, and an insulating film 43 is provided on the insulating film 42. The insulating films 42 and 43, for example, include silicon oxide.

One or more columnar sections 50 are included in the stacked body 15. The columnar sections 50 extend inside the stacked body 15 in the Z direction. The columnar section 50, for example, has a columnar shape (e.g. a substantially circular or a substantially oval columnar shape). The columnar sections 50 are respectively provided in the memory holes 80, and include a core portion 60, a channel 20, and a memory film 24.

The core portion 60, for example, includes silicon oxide. The shape of the core portion 60, for example, is a substantially columnar shape. The core portion 60 includes a plug portion 61 at an upper end of the core portion 60. The plug portion 61 is positioned in the insulating film 42 and its periphery is surrounded by the channel 20. The plug portion 61, for example, includes polysilicon (e.g. obtained by crystallizing amorphous silicon).

The channel 20 is provided around the core portion 60. A lower end of the channel 20 abuts the substrate 10. The channel 20 is a semiconductor portion and includes a body 20a and a cover layer 20b. The shape of the body 20a, for example, is a substantially cylindrical shape. The cover layer 20b is provided around the body 20a. The shape of the cover layer 20b, for example, is a substantially cylindrical shape.

The body 20a and the cover layer 20b each includes silicon, for example, polysilicon obtained by crystallizing amorphous silicon.

The memory film 24 is provided around the channel 20. As illustrated in FIG. 2, the memory film 24 includes a tunnel insulating film 21, a charge storage film 22, and a block insulating film 23. The tunnel insulating film 21 is provided around the channel 20. The tunnel insulating film 21, for example, includes silicon oxide. The shape of the tunnel insulating film 21, for example, is a substantially cylindrical shape.

The charge storage film 22 is provided around the tunnel insulating film 21. The charge storage film 22, for example, includes silicon nitride (SiN). The shape of the charge storage film 22, for example, is a substantially cylindrical shape. An intersection portion between the channel 20 and the electrode film 41 (e.g. a word line) can constitute a memory cell including the charge storage film 22.

The tunnel insulating film 21 can serve as a potential barrier between the charge storage film 22 and the channel 20. When charges move from the channel 20 to the charge storage film 22 (e.g. in a write operation) and when the charges move from the charge storage film 22 to the channel 20 (e.g. in an erase operation), the charges tunnel through the tunnel insulating film 21.

The charge storage film 22 includes a trap site for trapping charges. A threshold charge or voltage value of the memory cell may be changed according to the presence or absence or total number or magnitude of the charges. In this way, for example, the memory cell can retain information.

The block insulating film 23 is provided around the charge storage film 22. The block insulating film 23, for example, includes silicon oxide. When the electrode film 41 is formed, the block insulating film 23, for example, can protect the charge storage film 22 from etching. The block insulating film 23 may include a stacked film of a silicon oxide film and an aluminum oxide film.

Above the columnar sections 50, a plurality of bit lines 30 extending in the Y direction are provided. The bit lines 30 are connected to the columnar sections 50 via contact sections 31. Each contact section 31 is positioned in (e.g. is embedded in) the insulating film 43, and an upper end thereof is electrically connected to the bit line 30 and a lower end thereof is electrically connected to the plug portion 61. The contact section 31 includes a conductor such as a metal.

The electrode film 41 (e.g. the word line) of each layer of the stacked body 15 serves as a control gate in the memory cell, and a plurality of memory cells are arranged in a three-dimensional matrix configuration along the X direction, the Y direction, and the Z direction, so that data can be stored in each memory cell.

Next, a manufacturing method of a semiconductor memory device according to one or more embodiments of the present disclosure will be described.

FIG. 3 through FIG. 13 are sectional views illustrating some embodiments of a manufacturing method of the semiconductor memory device according to an aspect of the present disclosure. FIG. 3 through FIG. 13 show manufacture of regions of the semiconductor device 1 illustrated in FIG. 1, and correspond to regions shown below the insulating film 43 in FIG. 1.

In some embodiments of the manufacturing methods of the semiconductor memory device 1 of the present disclosure, as will be described later, processes performed after forming a through via hole 74 may be selected according to one or more determinations of a width W1 of an upper opening 74a of the through via hole 74. First, some embodiments of a manufacturing method of the semiconductor memory device 1 wherein the determined width W1 of the upper opening 74a of the through via hole 74 is within a range of values or is at or below a threshold value will be described in reference to FIG. 3 through FIG. 6.

Figure 3:
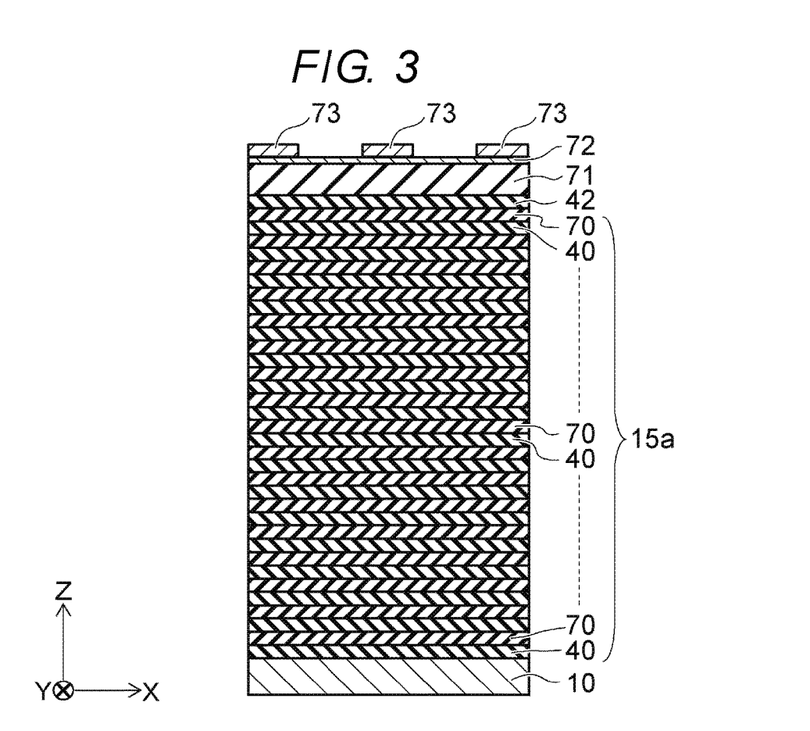
FIG. 3 is a sectional view illustrating a manufacturing method of a semiconductor memory device according to one or more embodiments.

As illustrated in FIG. 3, on a substrate 10 including silicon, for example, an insulating film 40 and a sacrificial film 70 are alternately stacked along the Z direction by, for example, a chemical vapor deposition (CVD) method, so that a stacked body 15a is formed. The sacrificial film 70 includes a material for which an etch selectivity is similar to that of the insulating film 40, e.g. silicon nitride. For example, the number of stacked insulating films 40 and the number of stacked sacrificial films 70 included in the stacked body 15a is in a range of from 20 to 50. Subsequently, the insulating film 42 is formed on the sacrificial film 70.

Subsequently, on the insulating film 42, a film 71 and a film 72 are sequentially formed. The film 71, for example, includes tetraethoxysilane (TEOS). The film 72, for example, is a carbon film (e.g. formed by CVD). The film 72 may be omitted in some implementations. Thereafter, by a photolithography method, a resist film 73 is formed and is exposed so as to pattern the resist film 73.

Figure 4:
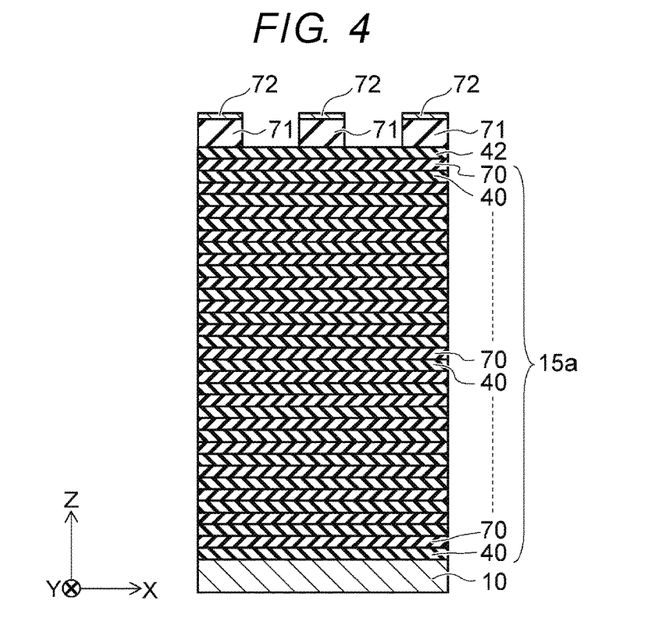
FIG. 4 is a sectional view illustrating a manufacturing method of the semiconductor memory device according to one or more embodiments.

Next, as illustrated in FIG. 4, for example, an etching process is performed, so that portions of the film 71 and the film 72 not covered by the resist film 73 are removed. Thereafter, the resist film 73 is removed.

Figure 5:
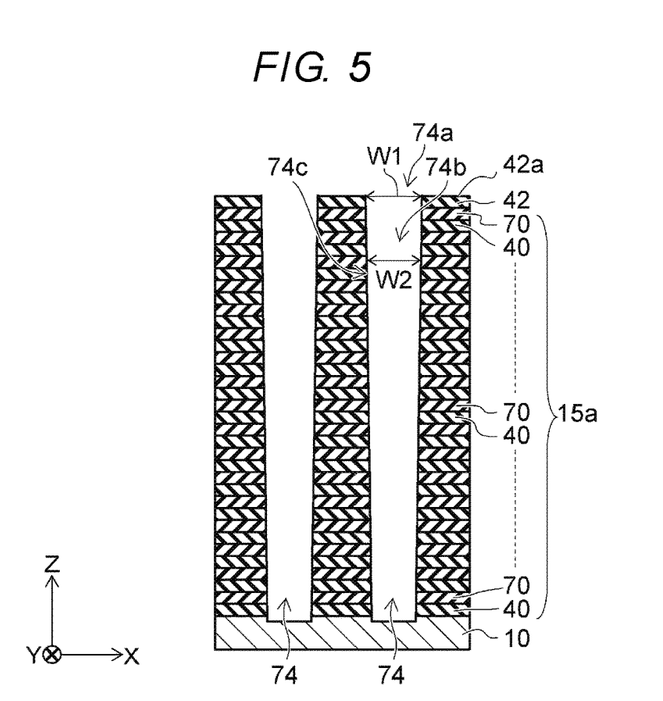
FIG. 5 is a sectional view illustrating the manufacturing method of the semiconductor memory device according to one or more embodiments.

Next, as illustrated in FIG. 5, for example, an etching process such as reactive ion etching (RIE) is performed from an upper surface 42a of the insulating film 42 not covered by the film 71 and the film 72 downward in the Z direction, so that a part of the insulating film 42 and a part of the stacked body 15a are removed and thus the through via hole 74 is formed. For example, when viewed from the Z direction, the shape of the through via hole 74 is a substantially circular shape or a substantially oval shape. The through via hole 74 extends to the substrate 10 by traversing at least a portion of the insulating film 42 and at least a portion of the stacked body 15a.

Subsequently, the width W1 of the upper opening 74a of the through via hole 74 is determined. The width W1 may be a maximum width of the upper opening 74a of the through via hole 74. In the case where the shape of the through via hole 74 is a substantially circular shape when viewed from the Z direction, the width W1 of the upper opening 74a of the through via hole 74 corresponds to a diameter of the circular upper opening 74a of the through via hole 74. For example, the width W1 of the upper opening 74a is determined using a scanning electron microscope such as critical dimension scanning electron microscope (CDSEM). The width W1 of the upper opening 74a may be determined by optically analyzing the shape of the through via hole 74. For example, the processed shape of the through via hole 74 is analyzed based on a reflection spectrum of infrared light, so that it is possible to determine the width W1 of the upper opening 74a.

Subsequently, it is determined whether the width W1 of the upper opening 74a of the through via hole 74 is within a first range of values, or is at or below a threshold value. When the width W1 of the upper opening 74a of the through via hole 74 is at or below the threshold value, it is determined that a width W2 of a wide portion 74b of the through via hole 74 is within a prescribed second range of values or is at or below a prescribed value. When the width W2 of the wide portion 74b is at or below the prescribed value, it can be determined to be within product specifications of the semiconductor memory device 1.

Figure 7:
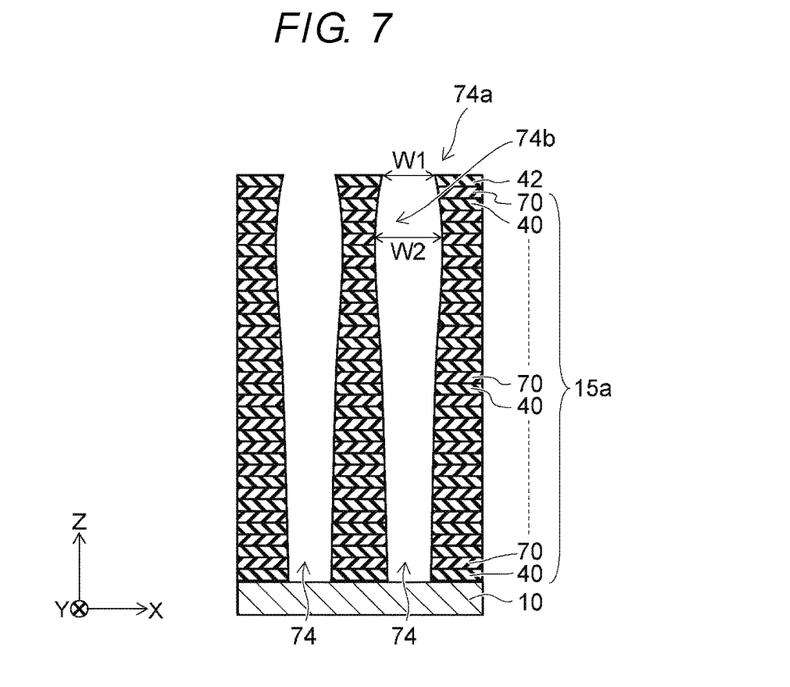
FIG. 7 is a sectional view illustrating the manufacturing method of the semiconductor memory device according to one or more embodiments.

The wide portion 74b of the through via hole 74 is an upper portion of the through via hole 74 and corresponds to, for example, a bulging part of a side surface 74c of the through via hole 74 (see, e.g., FIG. 7). The width W2 of the wide portion 74b is larger than the width of at least some other portions of the through via hole 74. For example, the wide portion 74b may be a widest portion of the through via hole 74. In the example shown in FIG. 5, in the through via hole 74, the wide portion 74b is positioned below the upper opening 74a. In other embodiments, the wide portion 74b may be positioned elsewhere (e.g. at the upper opening 74a).

The threshold value and the prescribed value are reference values relating to the width of the through via hole 74. For example, the threshold value and the prescribed value are values corresponding to one or more product specifications of the semiconductor memory device 1 such that the semiconductor memory device 1 performs according to specifications.

In the through via hole 74, based on the determined width W1 of the upper opening 74a, the width W2 of the wide portion 74b is determined. For example, the width W2 of the wide portion 74b is determined by referring to a table that describes a relation between the width W1 of the upper opening 74a and the width W2 of the wide portion 74b. Consequently, in the through via hole 74, the width W2 of the wide portion 74b is determined based on the width W1 of the upper opening 74a, and in some embodiments the width W2 of the wide portion 74b can be determined to be at or below the prescribed value if the width W1 of the upper opening 74a is at or below the threshold value.

In addition, the width W2 of the wide portion 74b may also be determined by optically analyzing the shape of the through via hole 74. In this case, it is possible to directly determine whether the width W2 is at or below the prescribed value without reference to the width W1.

Figure 6:
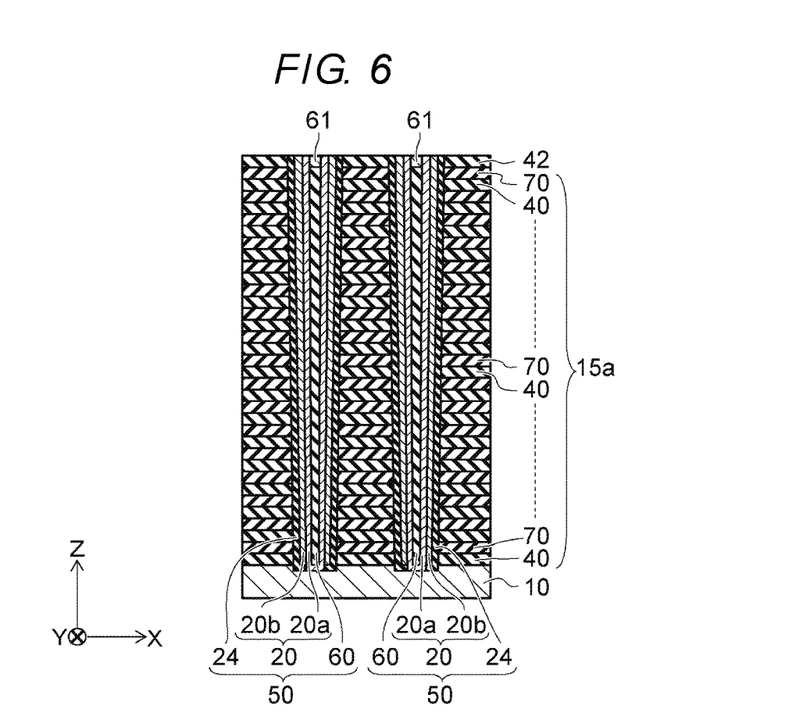
FIG. 6 is a sectional view illustrating the manufacturing method of the semiconductor memory device according to one or more embodiments.

Next, as illustrated in FIG. 6, when it is determined that the width W1 of the upper opening 74a of the through via hole 74 is at or below the threshold value (the width W2 of the wide portion 74b is at or below the prescribed value), silicon oxide is deposited on the inner surface of the through via hole 74 to form the block insulating film 23 (see FIG. 2), and silicon nitride is deposited to form the charge storage film 22 (see FIG. 2), and silicon oxide is deposited to form the tunnel insulating film 21 (see FIG. 2) by the CVD method, for example.

Subsequently, silicon is deposited to form the cover layer 20b. Thereafter, RIE is performed to remove the cover layer 20b, the tunnel insulating film 21, the charge storage film 22, and the block insulating film 23, so that the substrate 10 is exposed. In this way, the memory film 24 is formed.

Subsequently, silicon is deposited in the through via hole 74 to form the body 20a, and silicon oxide is deposited in the through via hole 74 to form the core portion 60. In this way, the channel 20 is formed. Furthermore, the columnar section 50 including the core portion 60, the channel 20, and the memory film 24 is formed. The body 20a of the channel 20 abuts the substrate 10. Thereafter, etching is performed to remove an upper portion of the core portion 60 in the through via hole 74, and silicon with introduced impurities is embedded, so that the plug portion 61 is formed.

Thereafter, a plurality of slits extending in the X direction and the Z direction are formed in the stacked body 15a, and the sacrificial film 70 is removed using the slits. A metal and the like are embedded in a space created by removing the sacrificial film 70 using the slits, so that the electrode film 41 is formed. In this way, the sacrificial film 70 is replaced with the electrode film 41, so that the stacked body 15 is formed.

In the processes illustrated in FIG. 3 through FIG. 6, the width W1 of the upper opening 74a is determined to be at or below the threshold value, from which it is inferred that the width W2 of the wide portion 74b is determined to be at or below the prescribed value. Then, the columnar section 50 including the channel 20 is formed in the through via hole 74. By so doing, the semiconductor memory device 1, in which the channel 20 is positioned in the memory hole 80, is manufactured.

Next, some manufacturing methods of a semiconductor memory device 1 in which the determined width W1 of the upper opening 74a of the through via hole 74 is larger than the threshold value will be described in reference to FIG. 7 through FIG. 13.

Since processes performed before the formation of the through via hole 74 may be the same as, or similar to, those of the above-described manufacturing method of the semiconductor memory device 1, a description of processes corresponding to those shown in FIG. 3 and FIG. 4 will be omitted. The below-described processes can be performed following the processes shown in FIG. 3 and in FIG. 4, for example.

As illustrated in FIG. 7, a part of the insulating film 42 and a part of the stacked body 15a are removed to form the through via hole 74, and then the width W1 of the upper opening 74a of the through via hole 74 is determined using a scanning electron microscope, for example.

Subsequently, it is determined whether the width W1 of the upper opening 74a of the through via hole 74 is at or below the threshold value. If the width W1 of the upper opening 74a of the through via hole 74 is larger than the threshold value, the width W2 of the wide portion 74b of the through via hole 74 is determined (e.g. is inferred) to be larger than the prescribed value in the through via hole 74. Since the width W2 of the wide portion 74b is larger than the prescribed value, the width W2 can be determined to be non-compliant with product specifications of the semiconductor memory device 1.

Based on the determined width W1 of the upper opening 74a, the width W2 of the wide portion 74b is determined. For example, the width W2 of the wide portion 74b is determined by reference to a table that describes one or more relations between the width W1 of the upper opening 74a and the width W2 of the wide portion 74b. The width W2 of the wide portion 74b is determined based on the width W1 of the upper opening 74a, and the width W2 of the wide portion 74b can be determined to be larger than the prescribed value if the width W1 of the upper opening 74a is larger than the threshold value. The width W2 of the wide portion 74b may also be determined directly, such as by optically analyzing the shape of the through via hole 74.

Figure 8:
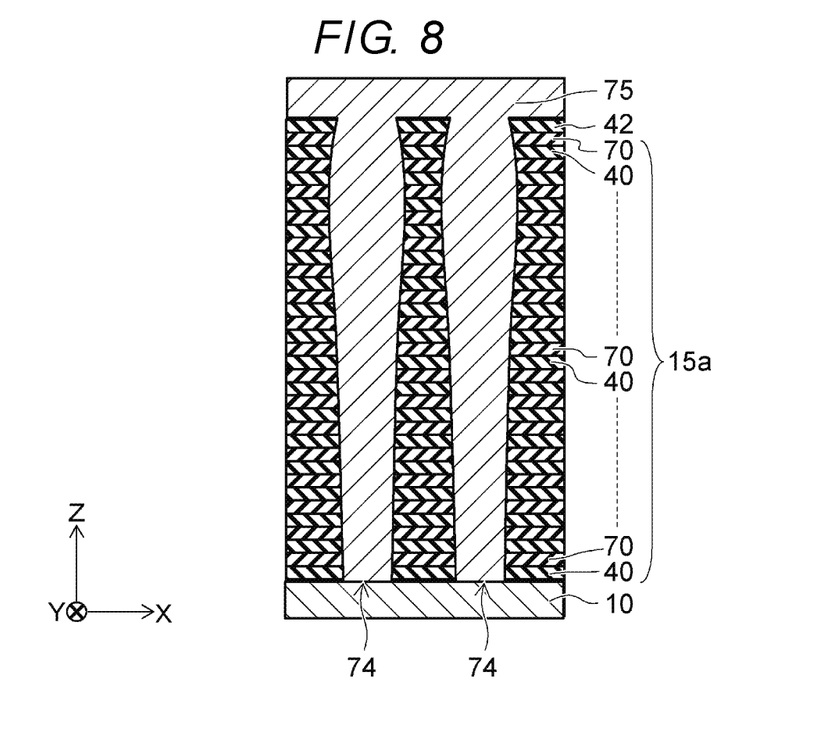
FIG. 8 is a sectional view illustrating the manufacturing method of the semiconductor memory device according to one or more embodiments.

Next, as illustrated in FIG. 8, responsive to the determination that the width W1 of the upper opening 74a of the through via hole 74 is larger than the threshold value and/or that the width W2 of the wide portion 74b is larger than the prescribed value, a sacrificial film 75 is formed in the through via hole 74. The sacrificial film 75 includes a material different from the material of the insulating film 40 and the sacrificial film 70. For example, in some embodiments, the insulating film 40 and the sacrificial film 70 do not include silicon, and the sacrificial film 75 includes silicon. The sacrificial film 75, for example, includes amorphous silicon. The sacrificial film 75 is formed in the through via hole 74 and on the insulating film 42.

Figure 9:
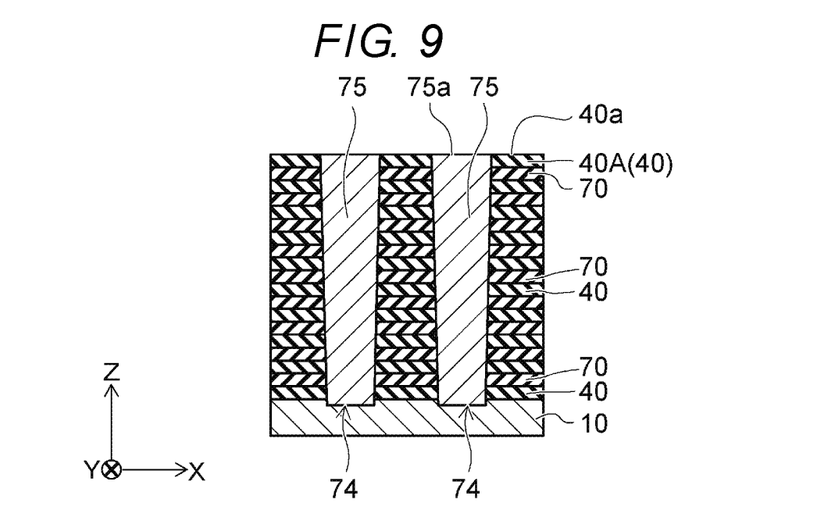
FIG. 9 is a sectional view illustrating the manufacturing method of the semiconductor memory device according to one or more embodiments.

Next, as illustrated in FIG. 9, by an etching process such as dry etching and wet etching, the insulating film 42, a part of the stacked body 15a, and a part of the sacrificial film 75 are removed. In this way, together with the part of the stacked body 15a, a part of the sacrificial film 75 including a part formed in the wide portion 74b of the through via hole 74 is removed.

Parts to be removed from the stacked body 15a and the sacrificial film 75, and thicknesses of those parts in a stacked direction, can be determined based on the width W2 of the wide portion 74b of the through via hole 74 and/or on the width W1 of the upper opening 74a. The number of stacked layers to be removed and/or which stacked layers to be removed of the stacked body 15a are determined based on the width W2. For example, one or more parts of the stacked body 15a that define the wide portion 74b, and corresponding one or more parts of the sacrificial layer 75, can be removed. For example, when a difference between the width W2 and the prescribed value is large, a correspondingly large part of the stacked body 15a and a correspondingly large part of the sacrificial film 75 can be removed, and difference between the width W2 and the prescribed value is small, a correspondingly small part of the stacked body 15a and a correspondingly small part of the sacrificial film 75 can be removed.

In the example shown in FIG. 9, apart of the stacked body 15a and a part of the sacrificial film 75 are removed, so that an upper surface 40a of an insulating film 40A disposed at an upper side of the stacked body 15a is substantially coplanar with an upper surface 75a of the sacrificial film 75.

Figure 10:
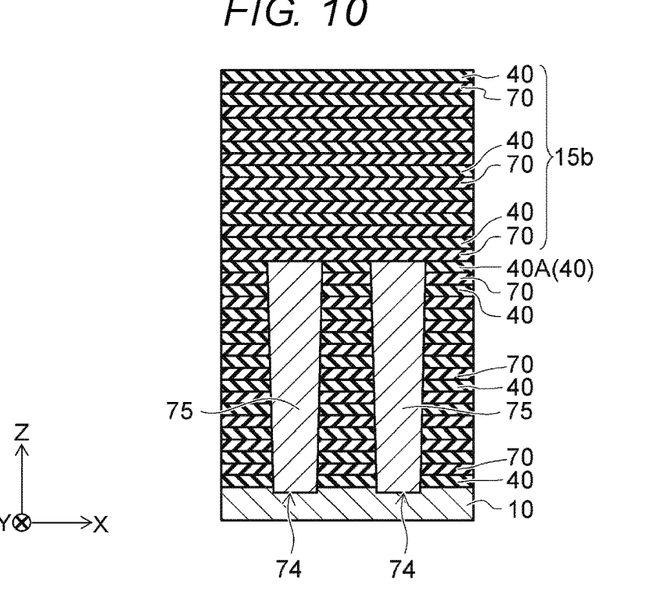
FIG. 10 is a sectional view illustrating the manufacturing method of the semiconductor memory device according to one or more embodiments.

Next, as illustrated in FIG. 10, for example, by the CVD method, the sacrificial film 70 and the insulating film 40 are alternately stacked along the Z direction, so that a stacked body 15b is formed.

Figure 11:
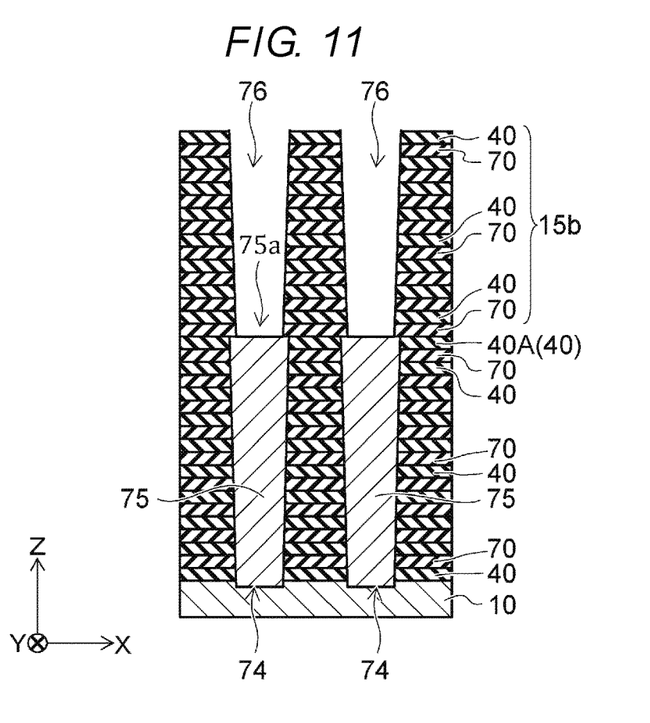
FIG. 11 is a sectional view illustrating the manufacturing method of the semiconductor memory device according to one or more embodiments.

Next, as illustrated in FIG. 11, by a photolithography method using a resist film as a mask and an etching process such as RIE, for example, a through via hole 76 is formed above the upper surface 75a of the sacrificial film 75 (e.g. to expose the upper surface 75a of the sacrificial film 75).

Figure 12:
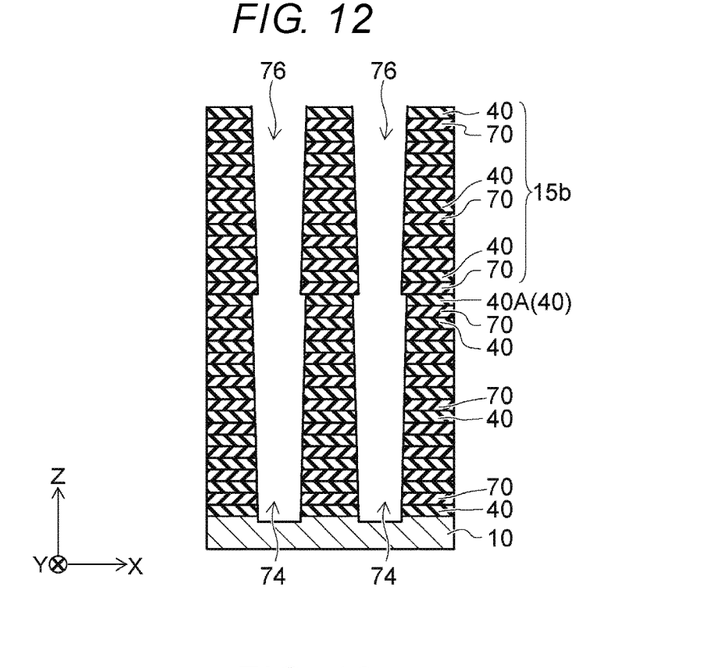
FIG. 12 is a sectional view illustrating the manufacturing method of the semiconductor memory device according to one or more embodiments.

Next, as illustrated in FIG. 12, by an etching process such as dry etching and wet etching, for example, the sacrificial film 75 is removed via the through via hole 76. As shown in FIG. 12, a width of an upper opening of the through via hole 74 can be larger than a width of a lower portion of the through via hole 76 (e.g. a width of a lower opening of the through via hole 76. The width of the upper opening of the through via hole 74 may, but need not, be about equal to the width of the lower opening of the through via hole 76.

Figure 13:
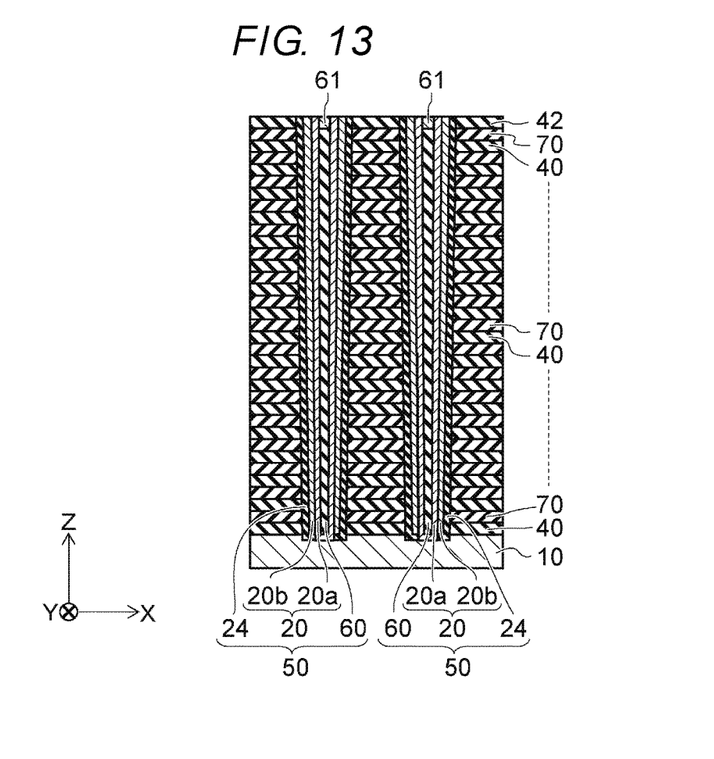
FIG. 13 is a sectional view illustrating the manufacturing method of the semiconductor memory device according to one or more embodiments.

Next, as illustrated in FIG. 13, on inner surfaces of the through via holes 74 and 76, the block insulating film 23 is formed, the charge storage film 22 is formed, and the tunnel insulating film 21 is formed. Subsequently, the cover layer 20b and the body 20a are formed, so that the core portion 60 is formed. In this way, the columnar section 50 including the core portion 60, the channel 20, and the memory film 24 is formed. Thereafter, the upper portion of the core portion 60 is removed to form the plug portion 61. The insulating film 40 of the uppermost layer of the stacked body 15b shown in FIG. 13 may correspond to the insulating film 42 illustrated in FIG. 1 through FIG. 6.

Thereafter, the sacrificial film 70 is removed using slits formed in the stacked body 15a. In a space created by removing the sacrificial film 70, the electrode film 41 is formed. In this way, the sacrificial film 70 is replaced with the electrode film 41, so that the stacked body 15 is formed.

In the processes illustrated in FIG. 7 through FIG. 13, the width W1 of the upper opening 74a is determined to be larger than the threshold value, based on which the width W2 of the wide portion 74b is determined to be larger than the prescribed value. Then, together with a part of the stacked body 15a, a part of the sacrificial film 75 including the part formed in the wide portion 74b of the through via hole 74 is removed. Moreover, after the stacked body 15b is formed, the columnar section 50 including the channel 20 and the like is formed in the through via holes 74 and 76. By so doing, the semiconductor memory device 1, in which the channel 20 is positioned in the memory hole 80, is manufactured.

Next, some advantages of one or more embodiments of the present disclosure will be described.

In a manufacturing method of a semiconductor memory device having a three-dimensional structure, when a memory hole is formed in a stacked body that includes a large number of stacked electrode films, a method of directly forming the memory hole in the stacked body and a method of forming the memory hole by alternately repeating the formation of the stacked body and the formation of through via holes can be used. For the former method, when the width of an upper portion of the memory hole is too wide and thus non-compliant with product specifications of the semiconductor memory device, productivity may be suboptimal. On the other hand, for the latter method, the number of processes and the manufacturing cost may increase as compared with the former method.

In one or more of the embodiments of manufacturing methods of the semiconductor memory device of the present disclosure, based on the determination of the width W1 of the upper opening 74a of the through via hole 74, when it is determined that the width W2 of the wide portion 74b of the through via hole 74 is at or below a prescribed value, the channel 20 is directly formed in the through via hole 74. On the other hand, based on the determination of the width W1 of the upper opening 74a of the through via hole 74, when it is determined that the width W2 of the wide portion 74b of the through via hole 74 is larger than the prescribed value, a part of the stacked body 15a defining the through via hole 74 is removed and then the stacked body 15b defining the through via hole 76 is formed, so that the channel 20 is formed in the through via holes 74 and 76.

Consequently, in one or more of the embodiments described herein, as illustrated in FIG. 3 through FIG. 13, processes performed after the formation of the through via hole 74 may differ according to whether the width W2 of the wide portion 74b of the through via hole 74 is determined to be at or below the prescribed value, or is determined to be larger than the prescribed value. In this way, when the width of the upper portion of the through via hole 74 is not wide, since the channel 20 is directly formed in the through via hole 74 as with the processes illustrated in FIG. 3 through FIG. 6, it is possible to reduce the number of processes and the cost of manufacture. When the width of the upper opening 74a of the through via hole 74 is determined to be wide, using the processes illustrated in FIG. 7 through 13, the semiconductor memory device 1 may be made to be compliant with product specifications of the semiconductor memory device 1 and thus productivity is improved.

The present disclosure provides for a manufacturing method of a semiconductor memory device in which the productivity is improved and the manufacturing cost is reduced.

In one or more embodiments of the present disclosure, as illustrated in FIG. 7 through FIG. 13, when it is determined that the width W2 of the wide portion 74b of the through via hole 74 is larger than the prescribed value, a part of the stacked body 15a defining the through via hole 74 is removed, and then the stacked body 15b defining the through via hole 76 is formed. The processes shown in FIG. 7 through FIG. 13 may be repeated any number of times. That is, a plurality of through via holes can be formed by the above-described methods, so that the memory hole 80 may be formed in the stacked body 15.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments have been described herein, these embodiments have been presented by way of example only, and are not intended to limit the scope of the present disclosure. Indeed, the embodiments described herein may be embodied in a variety of other forms and may be combined; furthermore, various omissions, substitutions and changes in the form of the embodiments described herein may be made without departing from the spirit of the present disclosure. The accompanying claims and their equivalents are intended to cover such forms or modifications as would fall within the scope and spirit of the inventions.

What is claimed is:

1. A manufacturing method of a semiconductor memory device, comprising:
   disposing a first stacked body comprising alternately stacked first insulating films and first films on a substrate;
   forming a first through via hole which extends in a stack direction of the first stacked body and traverses at least a portion of the first stacked body;
   determining to remove an upper portion of the first stacked body based on a comparison of a determined value of a width of the first through via hole with a reference value of the width of the first through via hole;
   forming a second film in the first through via hole responsive to the determination to remove the upper portion of the first stacked body;
   removing the upper portion of the first stacked body and a portion of the second film that is disposed in the first through via hole of the first stacked body;
   disposing a second stacked body comprising alternately stacked first films and first insulating films on the first stacked body and the second film;
   forming a second through via hole which extends in the stack direction and traverses at least a portion of the second stacked body to expose at least a portion of the second film; and
   removing the second film in the first through via hole via the second through via hole.

2. The manufacturing method of the semiconductor memory device according to claim 1, further comprising:
   forming a channel in the first through via hole and the second through via hole.

3. The manufacturing method of the semiconductor memory device according to claim 1, wherein the determining to remove the upper portion of the first stacked body comprises comparing a determined value of a width of an upper opening of the first through via hole with a threshold value of the width of the upper opening of the first through via hole, and when the determined value is larger than the threshold value, determining to remove the upper portion of the first stacked body.

4. The manufacturing method of the semiconductor memory device according to claim 3,
   wherein the determining to remove the upper portion of the first stacked body based on the comparison of the determined value of the width of the first through via hole with the reference value of the width of the first through via hole comprises determining a width of a wide part of the first through via hole positioned below the upper opening, which is determined based on the determined value of the width of the upper opening of the first through via hole.

5. The manufacturing method of the semiconductor memory device according to claim 1, wherein respective thicknesses in the stack direction of the upper portion of the first stacked body to be removed and the second film to be removed, are determined based on the determined value of the width of the first through via hole.

6. The manufacturing method of the semiconductor memory device according to claim 1, wherein
the first insulating films comprise silicon oxide,
the first films comprise silicon nitride, and
the second film comprises silicon.

7. The manufacturing method of the semiconductor memory device according to claim 1, wherein removing the upper portion of the first stacked body is performed after forming the second film in the first through via hole.

* * * * *